(12) United States Patent
Fang et al.

(10) Patent No.: US 7,825,737 B1
(45) Date of Patent: Nov. 2, 2010

(54) APPARATUS FOR LOW-JITTER FREQUENCY AND PHASE LOCKED LOOP AND ASSOCIATED METHODS

(75) Inventors: Steve Fang, Sunnyvale, CA (US); Chi Fung Cheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/334,701

(22) Filed: Dec. 15, 2008

Related U.S. Application Data

(60) Provisional application No. 61/014,221, filed on Dec. 17, 2007.

(51) Int. Cl.
*H03L 7/087* (2006.01)

(52) U.S. Cl. .............................. 331/11; 331/1 A; 331/8; 331/17; 331/25

(58) Field of Classification Search .................. 331/1 A, 331/8, 10–13, 16–18, 25; 327/156–159; 332/127; 360/51; 375/376; 455/260
See application file for complete search history.

(56) References Cited

U.S. PATENT DOCUMENTS

| 6,542,038 B2 * | 4/2003 | Nishimura et al. ........... 331/1 A |
| 6,754,147 B2 * | 6/2004 | Hsu et al. ................. 369/47.28 |

* cited by examiner

*Primary Examiner*—David Mis

(57) ABSTRACT

A frequency phase locked loop (FPLL) includes a first feedback loop coupled to a second feedback loop. The first feedback loop is configured to correct a phase offset of an output signal of the FPLL. The second feedback loop is configured to correct a frequency offset of the output signal of the FPLL.

28 Claims, 8 Drawing Sheets

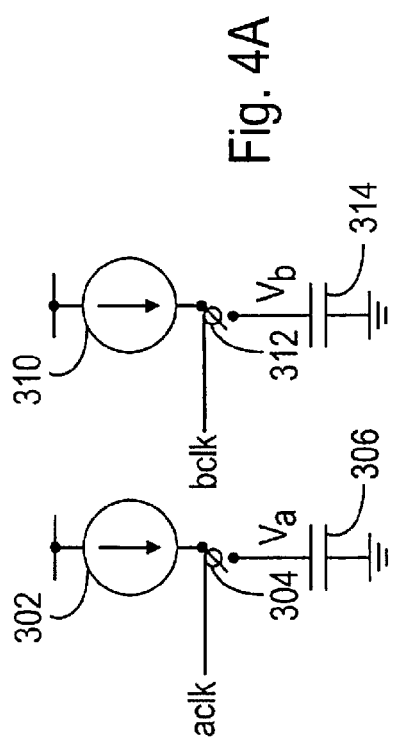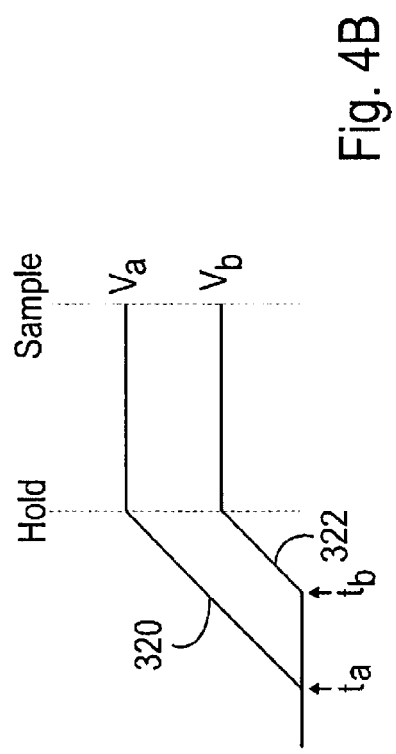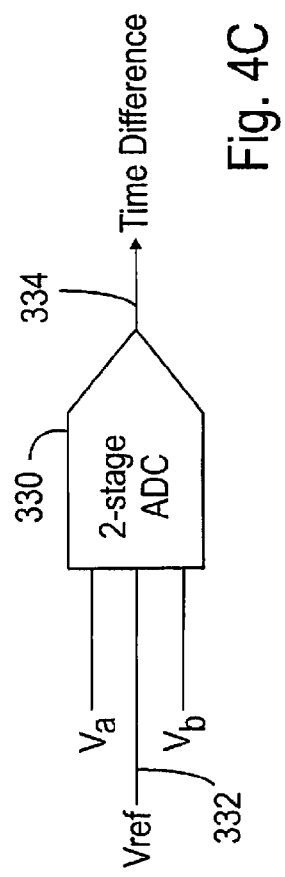
Fig. 4A
Fig. 4B
Fig. 4C

Fig. 7A

| Icp=10µA | Allpass | 7kHz | 14kHz | 28kHz | 56kHz |
|---|---|---|---|---|---|
| vcon (p-p) | 772uV | 887uV | 1.07mV | 1.67mV | 2.71mV |
| beta (p-p) | 17 | 20 | 22 | 29 | 29 |
| beta' (p-p) | 17 | 22 | 25 | 38 | 62 |

Fig. 7B

| Icp=40µA | Allpass | 7kHz | 14kHz | 28kHz | 56kHz |
|---|---|---|---|---|---|
| vcon (p-p) | 1.28mV | 1.36mV | 1.49mV | 1.61mV | 1.57mV |
| beta (p-p) | 8 | 9 | 9 | 7 | 6 |
| beta' (p-p) | 8 | 9 | 10 | 11 | 11 |

Fig. 7C

| Icp=80µA | Allpass | 7kHz | 14kHz | 28kHz | 56kHz |
|---|---|---|---|---|---|
| vcon (p-p) | 1.31mV | 1.38mV | 1.39mV | 1.39mV | 1.4mV |
| beta (p-p) | 5 | 6 | 5 | 5 | 4 |
| beta' (p-p) | 5 | 6 | 5 | 4 | 5 | ered as limiting its
APPARATUS FOR LOW-JITTER FREQUENCY AND PHASE LOCKED LOOP AND ASSOCIATED METHODS

CROSS-REFERENCE TO RELATED APPLICATIONS

This application claims priority to, and incorporates by reference, U.S. Provisional Patent Application Ser. No. 61/014,221, filed on Dec. 17, 2007, titled "New Low Jitter FPLL Architecture,".

TECHNICAL FIELD

The disclosed concepts relate generally to a signal generation apparatus and, more particularly, to an apparatus for generating signals with desired phase and/or frequency, and associated methods.

BACKGROUND

Frequency phase locked loops (FPLLs) are building blocks with wide application in electronic fields like communications, computers, and radio. FPLLs generate signals with relatively stable phase, frequency, or both. FPLLs can also recover signals in the presence of noise, facilitate generation of signals with frequencies that differ from a reference signal (e.g., clock signal generation and distribution circuits). Some applications require FPLLs with relatively low jitter in the output signal.

SUMMARY

One aspect of the disclosed concepts relates to apparatus for generating signals. In one exemplary embodiment, an FPLL includes a first feedback loop coupled to a second feedback loop. The first feedback loop is configured to correct a phase offset of an output signal of the FPLL. The second feedback loop is configured to correct a frequency offset of the output signal of the FPLL.

In another exemplary embodiment, an FPLL includes a time analog to digital converter (TADC), and an interpolator. The TADC generates a digital time difference value in response to an input signal and an output signal of a divider. The interpolator generates an output signal provided to the divider in response to an output signal of a voltage controlled oscillator (VCO) and the digital time difference value.

Another aspect of the disclosed concepts relates to methods of generating signals. In one exemplary embodiment, a method of generating a frequency and/or phase locked output signal includes using negative feedback in one feedback loop to correct a phase offset of the output signal. The method also includes using negative feedback in another feedback loop to correct a frequency offset of the output signal.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIG. 4A shows a sampling circuit as part of a time analog to digital converter (TADC) according to an exemplary embodiment.

FIG. 4B illustrates waveforms associated with the circuit arrangement of FIG. 4A.

FIG. 4C depicts an analog to digital converter (ADC) used in a time analog to digital converter (TADC) according to an exemplary embodiment.

FIG. 7A a table of high frequency filter cutoff frequencies, for a first bandwidth value, in an FPLL according to an exemplary embodiment.

FIG. 7B illustrates a table of high frequency filter cutoff frequencies, for a second bandwidth value, in an FPLL according to an exemplary embodiment.

FIG. 7C depicts a table of high frequency filter cutoff frequencies, for a third bandwidth value, in an FPLL according to an exemplary embodiment.

DETAILED DESCRIPTION

The disclosed concepts relate generally to a signal generation apparatus and, more particularly, to an FPLL apparatus for generating signals with desired phase and/or frequency, and associated methods. FPLLs according to the disclosed concepts provide relatively low output jitter.

Figure 1:
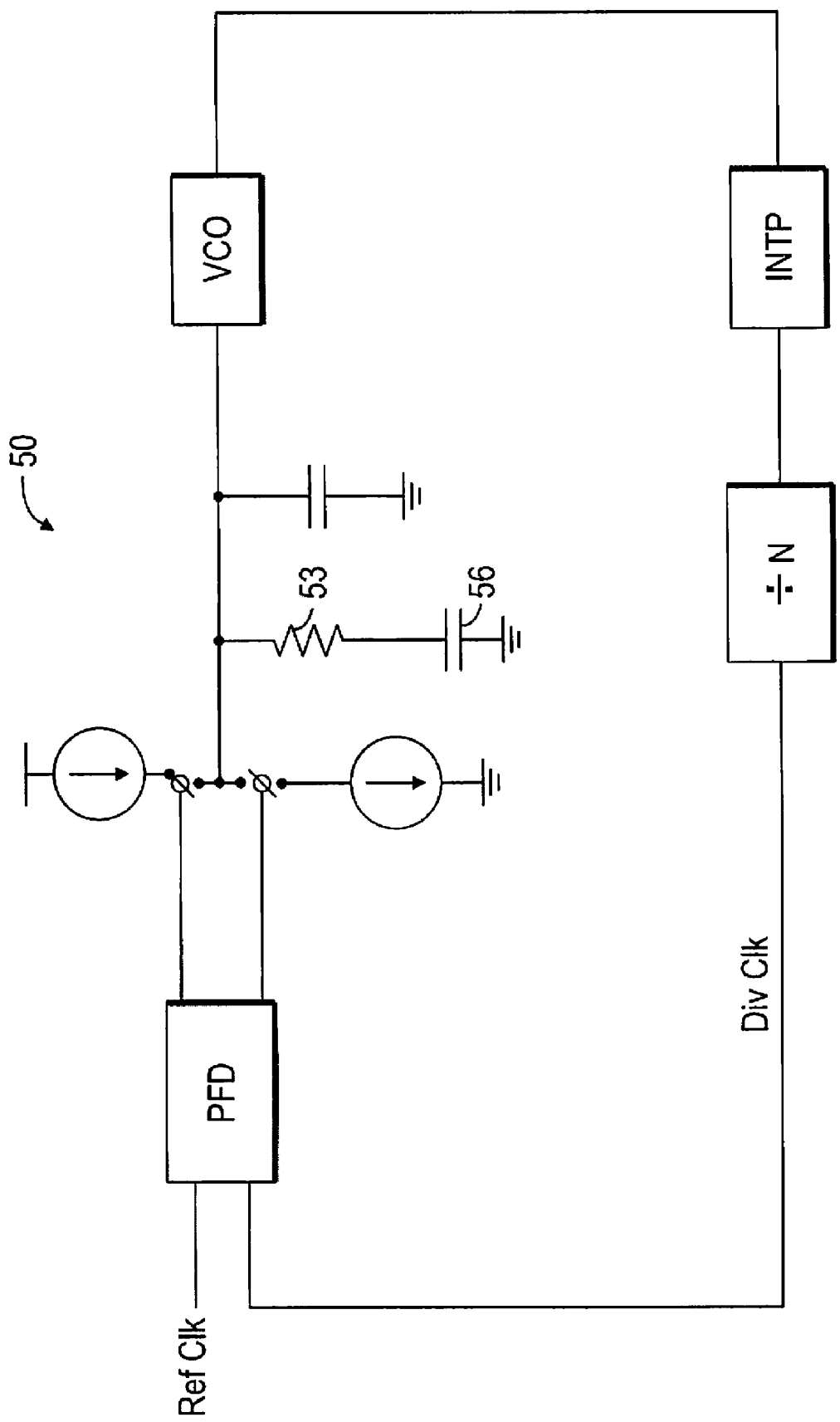
FIG. 1 illustrates a conventional FPLL circuit.

FIG. 1 shows a conventional FPLL 50. FPLL 50 uses a phase frequency detector (PFD) to compare reference and divided clock signals and generate control signals that operate a charge pump that uses a pair of switches coupled to current sources. The charge pump drives a filter that uses resistor 53 and capacitor 56. Thus, the filtered charge pump output drives the voltage-controlled oscillator (VCO). The output of the VCO drives an interpolator coupled to a frequency divider. The frequency divider provides a divided clock signal (Div-Clk), which the PFD compares with the reference clock (Ref-Clk). Conventional FPLLs, such as FPLL 50, produce relatively high levels of output jitter.

Figure 2B:
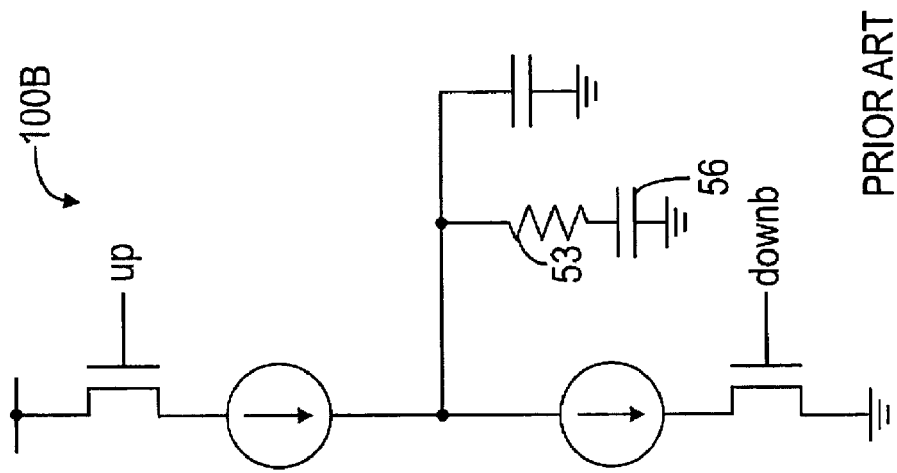
FIGS. 2A and 2B depict conventional charge pump circuits.
Figure 2A:
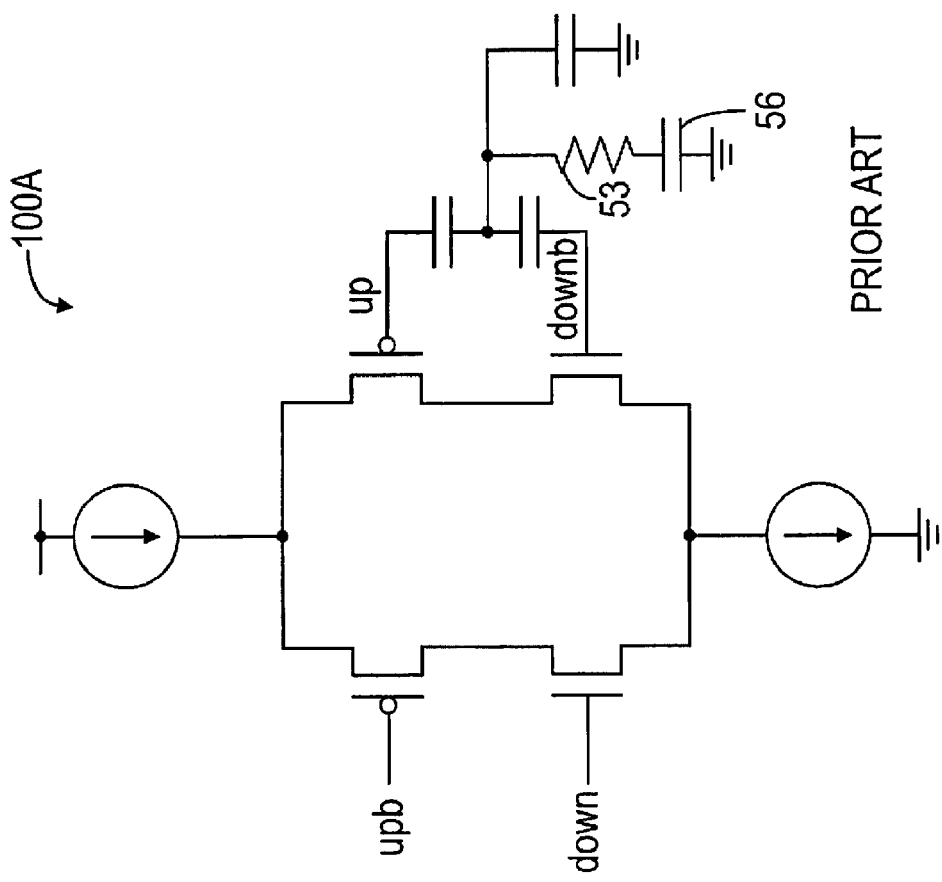

FIGS. 2A and 2B show two conventional embodiments, 100A and 100B, respectively, of implementing a charge pump, together with the filter (resistor 53 and capacitor 56). Referring to FIG. 2A, the charge pump includes four transistors biased by a pair of current sources. The output signals of the PFD (see FIG. 1) drive the four transistors. The output of the charge pump drives the filter, i.e., resistor 53 and capacitor 56. FIG. 2B shows a simpler charge pump circuit that includes two transistors driven by the output signals of the PFD (see FIG. 1). Two current sources bias the transistors in the charge pump. Similar to FIG. 2A, the output of the charge pump drives the filter, i.e., resistor 53 and capacitor 56.

In conventional FPLLs (see, for example, FIG. 1), the resistor (e.g., resistor 53) noise contributes to the majority of the output jitter. To reduce resistor noise, one may reduce the resistance of the resistor. Doing so, however, changes the FPLL bandwidth.

To maintain the same bandwidth, one would have to increase the capacitance of the filter capacitor (e.g., capacitor 56 in FIG. 1) and, hence, its area. One would also have to increase the charge pump current (see, for example, FIGS. 2A and 2B). Increasing the charge pump current will result in larger transistors, making the charge injection larger, and thus increasing the jitter.

Figure 3:
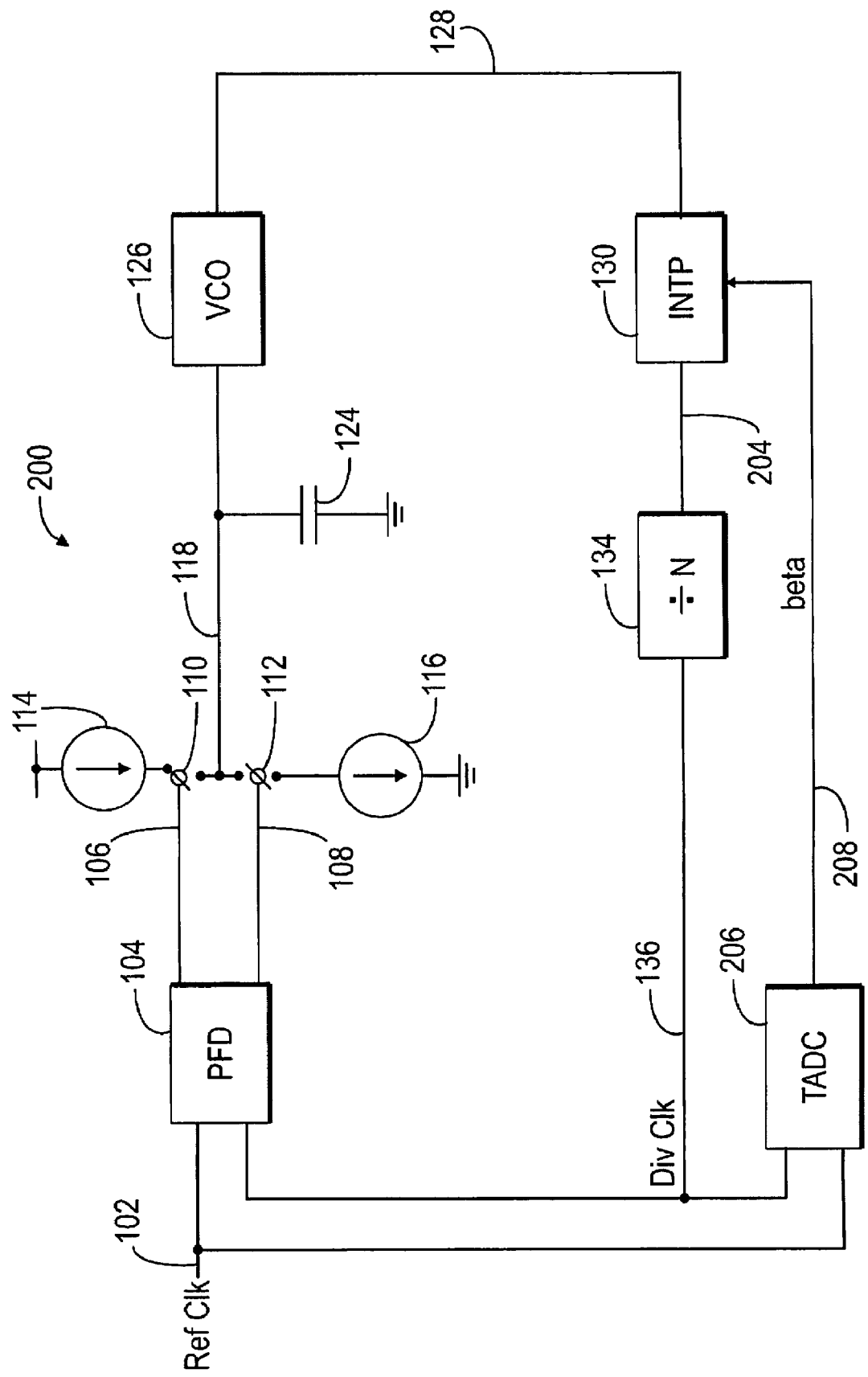
FIG. 3 illustrates an FPLL according to an exemplary embodiment.

FIG. 3 illustrates an exemplary embodiment of an FPLL 200 according to the disclosed concepts. Compared to conventional FPLLs (e.g., FPLL 50 in FIG. 1), FPLL 200 provides relatively low output jitter. Thus, one may use FPLL 200 in a variety of applications that specify relatively low output jitter (e.g., read channel circuitry).

Referring to FIG. 3, FPLL 200 includes phase/frequency detector (PFD) 104, current source 114, switch 110, current source 116, switch 112, loop capacitor 124, voltage controlled oscillator (VCO) 126, interpolator 130, divider 134, and time analog to digital converter (TADC) 206. The details of operation of PFD 104, current source 114, switch 110, current source 116, switch 112, loop capacitor 124, voltage controlled oscillator (VCO) 126, interpolator 130, and divider 134 fall within the knowledge of persons of ordinary skill in the art who have the benefit of the description of the disclosed concepts. One may use a variety of circuitry to implement PFD 104, current source 114, switch 110, current source 116, switch 112, loop capacitor 124, VCO 126, interpolator 130, and divider 134, as desired, depending on a particular implementation.

PFD 104 compares a reference clock (RefClk) 102 (or other input signal) with a divided clock signal 136 (DivClk) to generate up signal 106 and down signal 108. Up signal 106 controls switch 110, whereas down signal 108 controls switch 112.

Specifically, switch 110, switch 112, current source 114 and current source 116 constitute a charge pump circuit. Under control of up signal 106 and down signal 108, the charge pump circuit provides current to node 118. Loop capacitor 124 couples node 118 and circuit ground.

When up signal 106 causes switch 110 to turn ON, current source 114 provides current to node 118. Conversely, when down signal 108 causes switch 112 to turn ON, current source 116 drains current from node 118.

The voltage at node 118 constitutes the control voltage (Vcon) of VCO 126. In response to variations in the control voltage, the output frequency of VCO 126 (i.e., the frequency of signal 128) changes.

Output signal 128 of VCO 126 drives interpolator 130. Under the control of signal 208 (labeled 'beta'), interpolator 130 provides signal 204 to divider 134. Divider 134 divides the frequency of signal 204 by a factor N to generate signal 136 (DivClk). Note that N may have any suitable value, depending on a particular application.

TADC 206 receives as inputs reference clock signal 102 and divided clock signal 136. As described below in detail, signal 208 (beta) represents a time value that corresponds to the voltage difference between signal 102 and signal 136. Signal 208, as noted above, drives interpolator 130, and causes FPLL 200 to be stable. Interpolator 130 allows making changes in phase without corresponding changes in frequency. Thus, interpolator 130 effectively replaces the filter resistor (see, for example, resistor 53 in FIG. 1) of conventional FPLLs. In the absence of the resistor, the main source of noise is the noise generated by VCO 126.

Note that FPLL 200 includes two feedback loops. The first feedback loop includes PFD 104, switch 110, switch 112, current source 114, current source 116, capacitor 124, VCO 126, interpolator 130, and divider 134. The first feedback loop allows correcting, reducing, or adjusting the frequency or frequency offset of the output signal (e.g., output signal 128 of VCO 126) in FPLL 200 by using negative feedback.

The second feedback loop includes TADC 206, interpolator 130, and divider 134. The second feedback loop allows correcting, reducing, or adjusting the phase or phase offset of the output signal (e.g., output signal 128 of VCO 126) in FPLL 200 by using negative feedback.

Generally speaking, TADC 206 helps to keep FPLL 200 stable in the absence of the loop filter resistor. In other words, without TADC 206, one would have a type 1 PLL, which would oscillate in an unstable manner.

FIGS. 4A-4C provide details of TADC 206 according to an exemplary embodiment. Referring to FIG. 4A, TADC 206 includes current source 302, switch 304, and capacitor 306 coupled in a cascade configuration. TADC 206 also includes current source 310, switch 312, and capacitor 314 coupled in a cascade configuration.

An input signal, labeled as "aclk" in FIG. 4A (for example, RefClk signal 102 in FIG. 3) controls switch 304. Switch 304 allows the selective or controlled provision of current from current source 302 to capacitor 306. Thus, when signal aclk causes switch 304 to close (say, at time $t_a$), current source 304 provides charging current to capacitor 306. As a result, the voltage Va across capacitor 306 rises.

Similarly, an input signal, labeled as "bclk" in FIG. 4A (for example, DivClk signal 136 in FIG. 3) controls switch 312. Switch 312 allows the selective or controlled provision of current from current source 310 to capacitor 314. Hence, when signal bclk causes switch 312 to close (say, at time $t_b$), current source 310 provides charging current to capacitor 314. Accordingly, the voltage Vb across capacitor 314 rises.

FIG. 4B shows the waveforms associated with the circuit in FIG. 4A. As noted, switch 304 closes at time $t_a$, which causes voltage Va (denoted as signal 320) to rise in a linear or substantially or nearly linear fashion in response to the charging current from current source 302. Similarly, when switch 312 closes at time $t_b$, voltage Vb (denoted as signal 322) rises in a linear or substantially or nearly linear manner in response to the charging current from current source 310.

At the time labeled "hold," under the respective control of signals aclk and bclk, respectively, switch 304 and switch 312 open. From that time onward, capacitor 306 and capacitor 314 hold a steady (or nearly or substantially steady) charge. As a result, voltages Va and Vb (i.e., the voltages across capacitors 306 and 314, respectively), have constant (or nearly or substantially steady constant) values. Subsequently, at the time labeled "sample," one may sample the voltages Va and Vb.

Referring to FIG. 4C, signals Va and Vb drive the analog inputs of analog to digital converter (ADC) 330. Signal 332 (labeled as "Vref") provides a reference signal (e.g., a reference voltage) to ADC 330. One may use a variety of ways to implement ADC 330, as persons of ordinary skill in the art who have the benefit of the description of the disclosed concepts understand, for example, a two-stage ADC, as shown in FIG. 4C.

In response to the signals Va and Vb, ADC 330 provides an output signal 334 (beta). Because input signals Va and Vb represent voltages corresponding to time values, output signal 334 constitutes a digital time difference value, or code, (beta) at the output of TADC 206. The code (beta) controls interpolator 130, which helps attain stability of FPLL 200 (see FIG. 1), as described above.

In conventional FPLLs, a static phase error exists between the reference and divided signals. In FPLLs according to the disclosed concepts, a static error or offset may also exist between the reference and divided signals (e.g., RefClk 102 and DivClk 136) because of mismatches in the charge pump circuit. The static phase error results in a non-zero beta value (i.e., a non-zero value of signal 208 at the output of TADC 206), and a deviation of output frequency from its nominal value because the control voltage of VCO 126 is changed slightly. One aspect of the disclosed concepts involves techniques for removing all or substantially all or a relatively large portion of the static phase offset.

Figure 5:
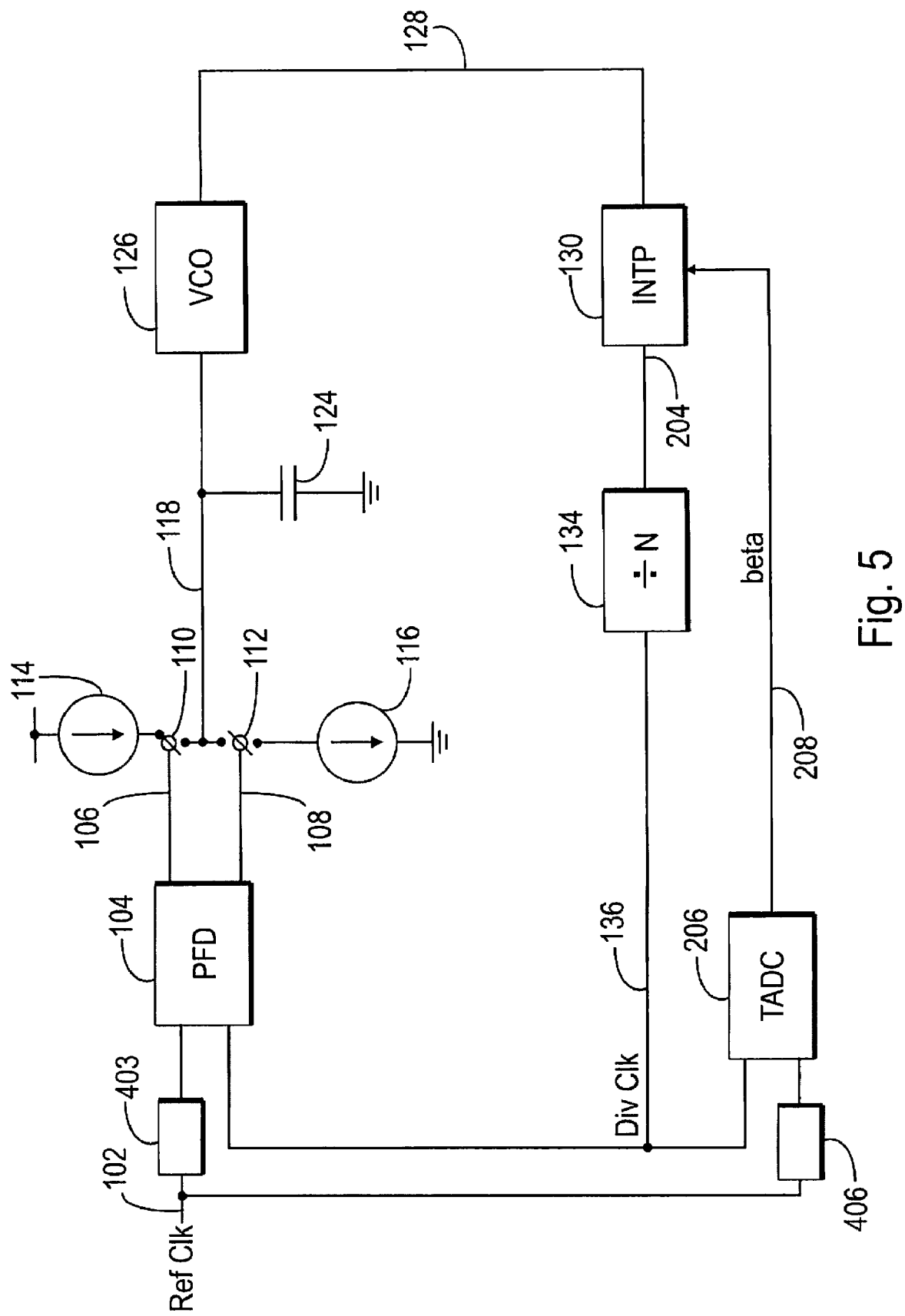
FIG. 5 illustrates an FPLL according to another exemplary embodiment.

FIG. 5 illustrates an FPLL according to another exemplary embodiment. The FPLL in FIG. 5 includes blocks and circuitry similar to the FPLL in FIG. 1. The various blocks and circuits in the FPLL of FIG. 5 operate in a similar manner to their counterparts in the FPLL of FIG. 1.

In addition, the FPLL in FIG. 5 includes delay block 403 and delay block 406. Delay block 403 couples RefClk signal 102 to an input of PFD 104. Delay block 406 couples RefClk signal 102 to an input of TADC 206. Charge pump mismatch current is equivalent to the delay mismatch between RefClk signal 102 and DivClk signal 136, which introduces static phase offset. Delay blocks 403 and 406 represent two delay mismatches (between RefClk signal 102 and DivClk signal 136) that might exist because of the existence of two feedback paths in the circuit shown in FIG. 5. In other words, delay blocks 403 and 406 represent unequal signal delay in the paths of RefClk signal 102 and DivClk signal 136, i.e., the clock buffering stages are not symmetric.

Figure 6:
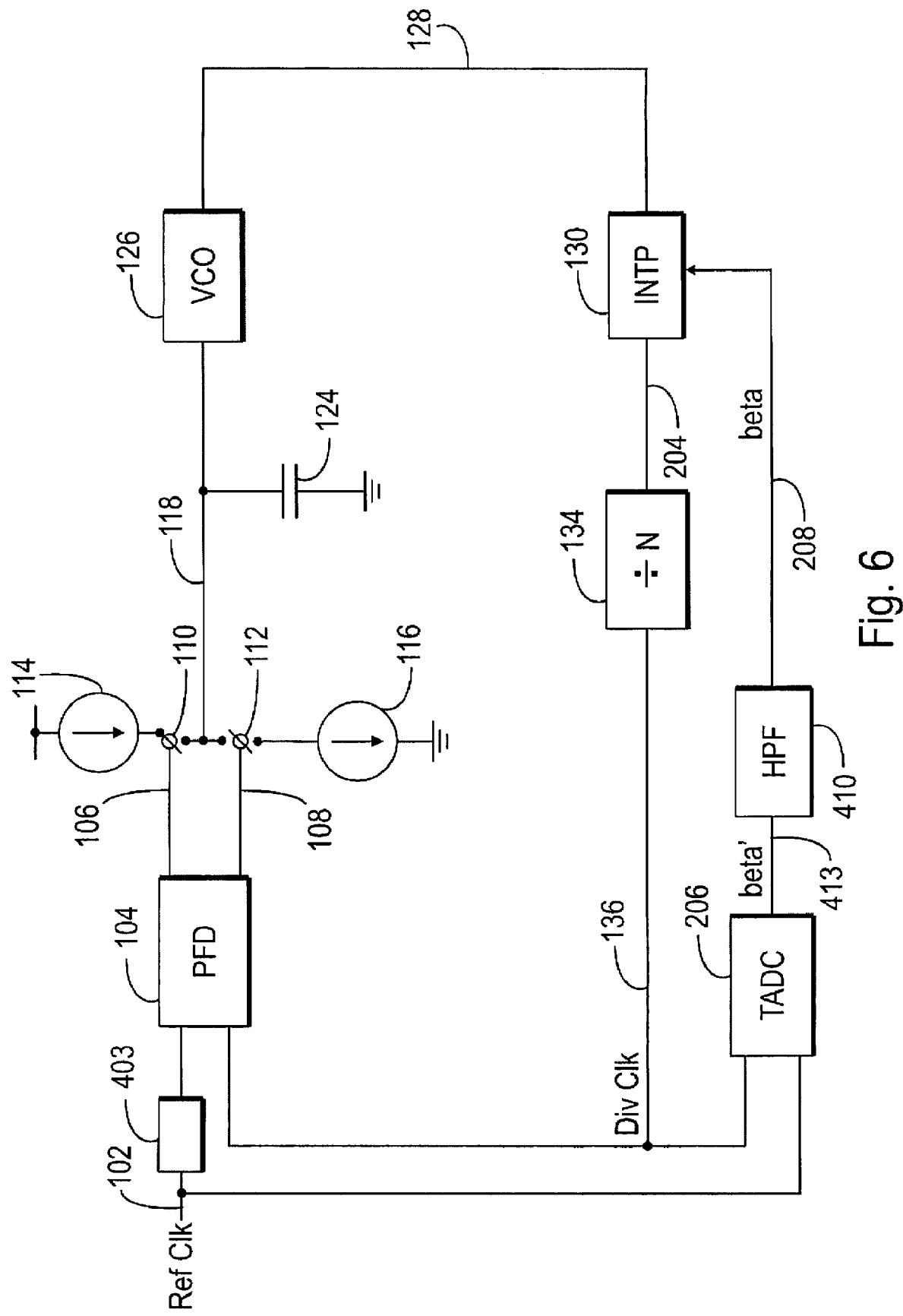
FIG. 6 depicts an FPLL according to an additional exemplary embodiment.

FIG. 6 depicts an FPLL according to an additional exemplary embodiment. The FPLL in FIG. 6 includes circuitry aimed at removing the static phase offset (or making the static phase offset relatively small). Removing or reducing the static phase offset will also remove a frequency offset from the output signal (e.g., signal 128) of the FPLL.

The FPLL in FIG. 6 includes blocks and circuitry similar to the FPLLs in FIGS. 1 and 5. The various blocks and circuits in the FPLL of FIG. 6 operate in a similar manner to their counterparts in the FPLLs of FIGS. 1 and 5. As noted above, delay block 403 represents delay mismatches in the path for RefClk signal 102 and DivClk signal 136. Put another way, delay block 403 is equivalent to the effect of a charge pump mismatch current.

In addition, the FPLL in FIG. 6 includes high pass filter (HPF) 410. HPF 410 couples between TADC 206 and interpolator 130. More specifically, the input of HPF 410 couples to the output 413 (providing signal beta') of TADC 206. The output of HPF 410 provides signal 208 (beta) to interpolator 130.

The addition of HPF 410 removes (or reduces) the phase offset in the FPLL. As noted above, the FPLL in FIG. 6 includes a phase feedback loop that includes TADC 206, interpolator 130, and divider 134. The addition of HPF 410 to this feedback loop causes the removal (or reduction) of phase offset in the FPLL. Put another way, with the addition of HPF 410, the output of TADC 206 is zero, meaning that no static phase difference between RefClk signal 102 and DivClk signal 136 exists.

Removing (or reducing) the phase offset also improves the frequency locking performance of the FPLL. Thus, the overall performance of the FPLL improves.

More specifically, as noted above, the FPLL in FIG. 6 includes a frequency feedback loop that includes PFD 104, current source 114, switch 110, switch 112, current source 116, capacitor 124, VCO 126, interpolator 130, and divider 134. Removing the phase offset in the phase feedback loop causes the removal (or reduction) of the frequency offset, i.e., improved frequency locking in the frequency feedback loop.

FIGS. 7A-7C show tables of cutoff frequencies for HPF 410 for various bandwidths in an FPLL according to an exemplary embodiment. The values in FIGS. 7A-7C correspond to a 25 KHz reference jitter applied to the FPLL.

The tables in FIGS. 7A-7C correspond, respectively, to various bandwidths of the frequency feedback loop, described above. Specifically, FIGS. 7A-7C correspond to frequency loop bandwidths of 16 KHz, 64 KHz, and 128 KHz, respectively. Furthermore, the values in FIGS. 7A-7C correspond to charge pump currents of 10 µA, 40 µA, and 80 µA, respectively.

The left-most columns of the tables in FIGS. 7A-7C provide control voltage of VCO 126, and the values of beta and beta' (see, for example, FIG. 6). The row across the top of each table corresponds to an allpass filter (i.e., no high pass filtering applied to the output of TADC 206), and various cut off frequencies for HPF 410.

Referring to FIGS. 7A-7C, the reference clock signal has a 25 KHz jitter. When the charge pump current is high, the frequency loop bandwidth is also higher. The high-pass cutoff frequency depends on the frequency loop bandwidth. For frequency loop bandwidth of 64 KHz, the high-pass cutoff can be 7 KHz without any information loss in signal beta'. For a 128 KHz bandwidth, there is no information loss in beta' with a 14 KHz high-pass cutoff. Thus, using frequency loop bandwidth and high-pass cutoff frequencies that are an order or magnitude apart provides better jitter tracking for the loop that includes TADC 206.

Figure 8:
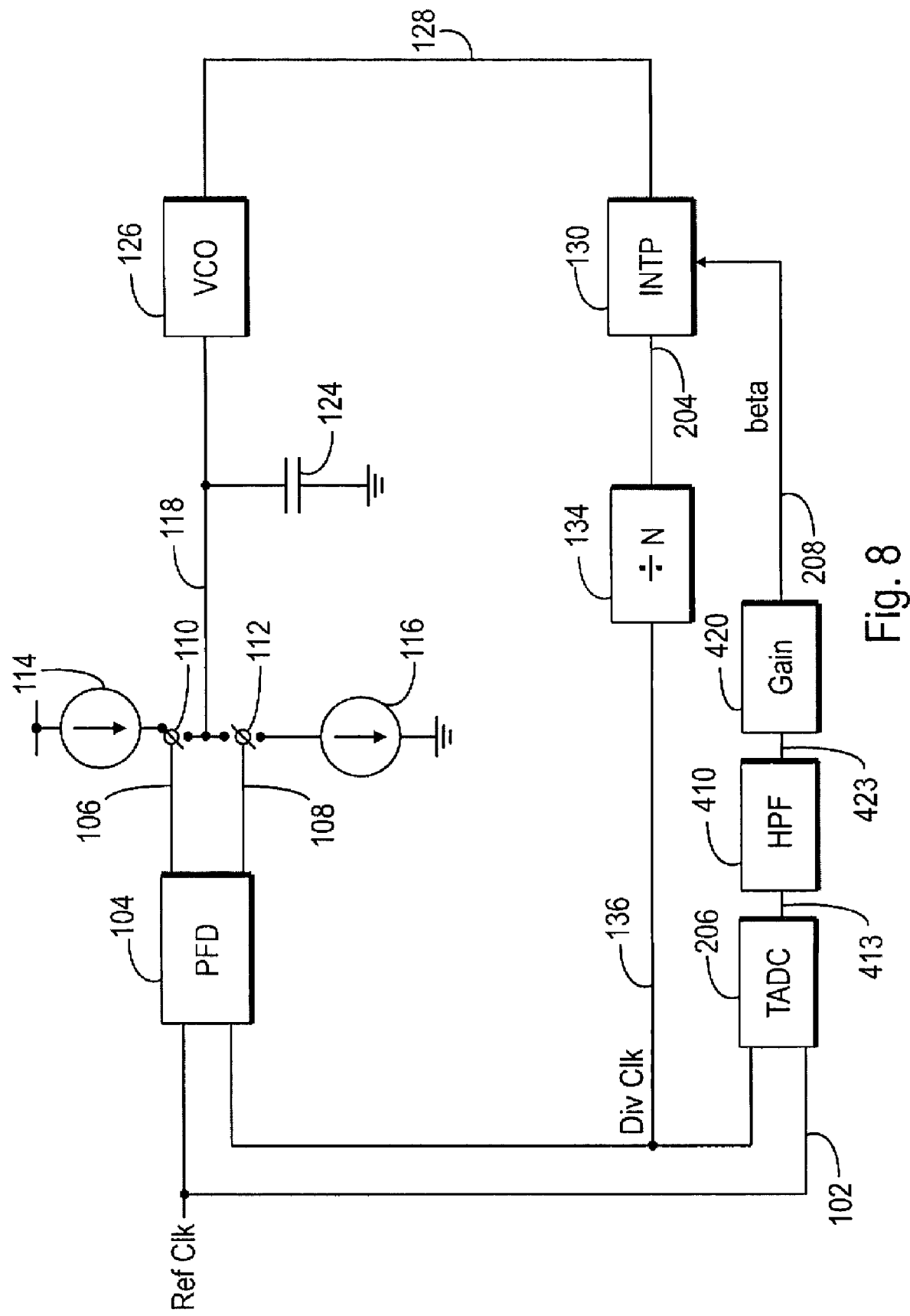
FIG. 8 illustrates an FPLL according to yet another exemplary embodiment.

FIG. 8 illustrates an FPLL according to yet another exemplary embodiment. The FPLL in FIG. 8 includes circuitry aimed at further reducing noise and jitter.

The FPLL in FIG. 8 includes blocks and circuitry similar to the FPLLs in FIGS. 1, 5, and 6. The various blocks and circuits in the FPLL of FIG. 8 operate in a similar manner to their counterparts in the FPLLs of FIGS. 1, 5, and 6.

In addition, the FPLL in FIG. 8 includes gain circuit or block 420. Gain block 420 couples HPF 410 and interpolator 130. More specifically, the input of gain block 410 couples to the output 423 of HPF 410. The output of gain block 420 provides signal 208 (beta) to interpolator 130. The addition of gain block 420 allows the further reduction of noise and jitter in FPLLs according to the disclosed concepts.

When the reference signal (e.g., RefClk 102) constitutes a clean (i.e., contains relatively little noise) signal, the FPLL in FIG. 8 has a relatively higher bandwidth than conventional FPLLs. Thus, the FPLL in FIG. 8 provides improved performance.

Conversely, when the reference signal (e.g., RefClk 102) contains noise, one may reduce the bandwidth of the FPLL by reducing the gain of gain block 420. Doing so effectively filters out the jitter from the reference signal, thus resulting in lower noise compared to a conventional FPLL.

Furthermore, note that the overall loop bandwidth in the FPLL of FIG. 8 is determined by the gain of the phase locked loop and update rate. Thus, one may use a smaller value for the gain (KVCO) of VCO 126 because the overall loop bandwidth of the FPLL in FIG. 8 is independent (or nearly or substantially independent) of KVCO. Smaller values of KVCO also lead to smaller noise levels and reduced jitter, thus improving performance.

As persons of ordinary skill in the art who have the benefit of the description of the disclosed concepts understand, one may apply the disclosed concepts effectively to FPLLs used in various applications. Examples described in this document constitute merely illustrative applications, and are not intended to limit the application of the disclosed concepts to other fields of technology by making appropriate modifications. Those modifications fall within the knowledge and level of skill of persons of ordinary skill in the art who have the benefit of the description of the disclosed concepts.

For example, one may use FPLLs according to the disclosed concepts in telecommunication systems, for instance, to generate local oscillator signals. As other examples, one may use FPLLs according to the disclosed concepts in signal processing, clock generation (e.g., clock multipliers and/or dividers), and clock distribution systems.

Furthermore, the input signal of the FPLL might constitute a variety of types of signal. For example, the input signal in some embodiments might constitute a clock signal (e.g., a reference clock signal, or RefClk). In other embodiments, the input signal might constitute a general reference signal, for example, an output of an oscillator or other type of signal. The divided signal in the FPLL would have a type corresponding to the type of the input signal (e.g., DivClk when the input signal constitutes a reference clock signal, e.g., RefClk).

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

We claim:

1. A frequency phase locked loop (FPLL), comprising:
   a first feedback loop configured to correct a phase offset of an output signal of the FPLL, wherein the first feedback loop comprises a time analog to digital converter (TADC) coupled to an interpolator; and
   a second feedback loop coupled to the first feedback loop, the second feedback loop configured to correct a frequency offset of the output signal of the FPLL.

2. The frequency phase locked loop (FPLL) according to claim 1, wherein the first feedback loop further comprises a divider coupled to (i) the interpolator and (ii) the time analog to digital converter (TADC).

3. The frequency phase locked loop (FPLL) according to claim 1, wherein the time analog to digital converter (TADC) comprises (i) a first current source coupled to a first switch and a first capacitor and (ii) a second current source coupled to a second switch and second capacitor.

4. The frequency phase locked loop (FPLL) according to claim 3, wherein the time analog to digital converter (TADC) further comprises an analog to digital converter (ADC) coupled to the first and second capacitors.

5. The frequency phase locked loop (FPLL) according to claim 3, wherein (i) the first switch operates in response to a first clock signal in order to couple the first current source to the first capacitor and (ii) the second switch operates in response to a second clock signal in order to couple the second current source to the capacitor.

6. The frequency phase locked loop (FPLL) according to claim 1, wherein the first feedback loop further comprises a filter coupled to (i) the time analog to digital converter (TADC) and (ii) the interpolator.

7. The frequency phase locked loop (FPLL) according to claim 6, wherein the filter comprises a high pass filter.

8. The frequency phase locked loop (FPLL) according to claim 6, wherein the first feedback loop further comprises a gain block coupled to (i) the filter and (ii) the interpolator.

9. The frequency phase locked loop (FPLL) according to claim 2, wherein the second feedback loop comprises the interpolator and the divider.

10. The frequency phase locked loop (FPLL) according to claim 3, wherein the second feedback loop further comprises a phase/frequency detector, a charge pump circuit, a capacitor, and a voltage controlled oscillator (VCO).

11. The frequency phase locked loop (FPLL) according to claim 3, wherein the second feedback loop further comprises the interpolator and a divider.

12. The frequency phase locked loop (FPLL) according to claim 3, wherein the second feedback loop further comprises the interpolator and a divider.

13. The frequency phase locked loop (FPLL) according to claim 6, wherein the second feedback loop further comprises the interpolator and a divider.

14. The frequency phase locked loop (FPLL) according to claim 8, wherein the second feedback loop further comprises the interpolator and a divider.

15. A frequency phase locked loop (FPLL), comprising:
    a time analog to digital converter (TADC) that generates a digital time difference value in response to (i) an input signal and (ii) an output signal of a divider; and
    an interpolator that generates an output signal provided to the divider in response to (i) an output signal of a voltage controlled oscillator (VCO) and (ii) the digital time difference value.

16. The frequency phase locked loop (FPLL) according to claim 15, further comprising a phase/frequency detector that generates an up signal and a down signal in response to (i) the input signal and (ii) the output signal of the divider.

17. The frequency phase locked loop (FPLL) according to claim 16, further comprising a charge pump circuit that provides a charge pump signal to the voltage controlled oscillator (VCO) in response to (i) the up signal and (ii) the down signal.

18. The frequency phase locked loop (FPLL) according to claim 15, further comprising a filter coupled to (i) the time analog to digital converter (TADC) and (ii) the interpolator.

19. The frequency phase locked loop (FPLL) according to claim 18, wherein the filter comprises a high pass filter.

20. The frequency phase locked loop (FPLL) according to claim 18, further comprising a gain block coupled to (i) the filter and (ii) the interpolator.

21. The frequency phase locked loop (FPLL) according to claim 20, wherein the filter comprises a high pass filter.

22. The frequency phase locked loop (FPLL) according to claim 16, wherein the time analog to digital converter (TADC) comprises a sampling circuit coupled to an analog to digital converter.

23. A method of generating a frequency and/or phase locked output signal, the method comprising:

using negative feedback in a first feedback loop to correct a phase offset of the output signal; and using negative feedback in a second feedback loop to correct a frequency offset of the output signal, wherein using negative feedback in the first feedback loop to correct the phase offset of the output signal comprises (i) generating a digital time difference value in response to an input signal and divided signal, and (ii) using the digital time difference value to interpolate an oscillator signal.

24. The method according to claim 23, wherein using negative feedback in the second feedback loop to correct the frequency offset of the output signal comprises:

comparing phase/frequency of the input signal with the phase/frequency of the divided signal to generate an up signal and a down signal;

generating a current in response to (i) the up signal and (ii) the down signal; and controlling a frequency of the oscillator signal in response to the current.

25. The method according to claim 24, wherein using negative feedback in the first feedback loop to correct the phase offset of the output signal further comprises filtering the digital time difference value to generate a filtered signal.

26. The method according to claim 25, wherein using negative feedback in the first feedback loop to correct the phase offset of the output signal further comprises applying a gain to the filtered signal.

27. The method according to claim 25, wherein filtering the digital time difference value to generate the filtered signal comprises high pass filtering the digital time difference value.

28. The method according to claim 23, wherein the input signal comprises a reference clock signal, and output signal comprises a frequency phase locked signal.

* * * * *